(12) United States Patent
Ramorini et al.

(10) Patent No.: US 10,326,418 B2
(45) Date of Patent: Jun. 18, 2019

(54) LARGE INPUT SWING CIRCUIT, CORRESPONDING DEVICE AND METHOD

(71) Applicant: STMicroelectronics S.r.l., Agrate Brianza (MB) (IT)

(72) Inventors: Stefano Ramorini, Arluno (IT); Alberto Cattani, Cislago (IT); Alessandro Gasparini, Cusano Milanino (IT); Germano Nicollini, Piacenza (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/982,548

(22) Filed: May 17, 2018

(65) Prior Publication Data

US 2018/0337647 A1 Nov. 22, 2018

(30) Foreign Application Priority Data

May 19, 2017 (IT) .......................... 102017000054686

(51) Int. Cl.

| H03M 1/66 | (2006.01) |
|---|---|
| H03F 3/45 | (2006.01) |
| H03M 1/12 | (2006.01) |
| H03M 1/68 | (2006.01) |
| H03M 1/74 | (2006.01) |
| H03M 1/76 | (2006.01) |

(52) U.S. Cl.
CPC ........ *H03F 3/45192* (2013.01); *H03M 1/124* (2013.01); *H03M 1/66* (2013.01); *H03F 2200/18* (2013.01); *H03M 1/68* (2013.01); *H03M 1/742* (2013.01); *H03M 1/765* (2013.01)

(58) Field of Classification Search
CPC ............ H03F 3/45192; H03F 2200/18; H03M 1/124; H03M 1/66; H03M 1/747; H03M 1/00; H03M 1/80
USPC .......................................... 341/144, 145, 153
See application file for complete search history.

(56) References Cited

U.S. PATENT DOCUMENTS

| 3,538,449 A * | 11/1970 | Solomon ................... H03F 1/48 330/255 |
|---|---|---|
| 6,747,514 B1 | 6/2004 | Aude |
| 6,891,433 B2 * | 5/2005 | Schrader ............... H03F 3/3023 330/253 |
| 7,098,831 B2 | 8/2006 | Confalonieri et al. |

(Continued)

OTHER PUBLICATIONS

IT Search Report and Written Opinion for IT Appl. No. 2017000054686 dated Jan. 12, 2018 (7 pages).

(Continued)

*Primary Examiner* — Jean B Jeanglaude
(74) *Attorney, Agent, or Firm* — Crowe & Dunlevy (57) ABSTRACT

A circuit includes an input transistor pair with first and second input transistors, the first input transistor having a control terminal configured to receive an input signal and a cascode transistor pair including a first and second cascode transistors having a common control node. A bias circuit has a bias input configured to receive the input signal and a first bias output coupled to the common node of the first and second cascode transistors. The bias circuit includes a signal tracking circuit operating to generate the first bias output to track the input signal. A pair of load transistors are coupled to the input transistor pair and biased by a second bias output of the bias circuit.

24 Claims, 4 Drawing Sheets

(56) References Cited

U.S. PATENT DOCUMENTS

| | | | |
|---|---|---|---|
| 7,348,912 B2 | 3/2008 | Confalonieri et al. | |
| 7,746,170 B2* | 6/2010 | Amini | H03F 3/3022 330/255 |
| 7,920,028 B2* | 4/2011 | Arai | H03F 1/223 330/296 |
| 8,502,603 B2* | 8/2013 | Nandy | H03F 1/0266 330/253 |
| 9,083,287 B2* | 7/2015 | Papamichail | H03F 3/16 |
| 2006/0226893 A1 | 10/2006 | Abel | |
| 2007/0268074 A1* | 11/2007 | Vejzovic | H03F 1/0266 330/296 |
| 2009/0289716 A1* | 11/2009 | Jaeger | H03F 1/0272 330/261 |
| 2010/0207692 A1* | 8/2010 | Arai | H03F 1/223 330/296 |
| 2012/0032939 A1* | 2/2012 | Tsuchi | G09G 3/3614 345/211 |
| 2013/0127537 A1* | 5/2013 | Nandy | H03F 1/0266 330/261 |
| 2013/0300484 A1* | 11/2013 | Ryat | H03F 3/45183 327/307 |
| 2015/0270812 A1* | 9/2015 | Papamichail | H03F 3/16 330/296 |

OTHER PUBLICATIONS

Boni, Andrea et al: "A 10-b 185-MS/s Track-and-Hold in 0.35-μm CMOS," IEEE Journal of Solid-State Circuits, vol. 36, No. 2, Feb. 2001, pp. 195-203.

* cited by examiner

LARGE INPUT SWING CIRCUIT, CORRESPONDING DEVICE AND METHOD

PRIORITY CLAIM

This application claims the priority benefit of Italian Application for Patent No. 102017000054686, filed on May 19, 2017, the disclosure of which is hereby incorporated by reference in its entirety to the maximum extent allowable by law.

TECHNICAL FIELD

The description relates to electronic circuits.

One or more embodiments may be applied in buffer circuit stages for digital-to-analog or analog-to-digital converters.

BACKGROUND

Electronic circuits exposed in operation to large variability of, for example, input voltage (that is large input swings) have been an area of extensive research and development over the years.

Buffer circuits for digital-to-analog or analog-to-digital converters (DACs or ADCs) are exemplary of possible applications of such circuits.

Despite that intensive activity in that area, further improved solutions are still desirable, for example, in respect of one or more of the following aspects:
- availability of flexible solutions suited for use in any circuit exposed to large input voltage swings,
- improved performance when used in DACs or ADCs,
- possibility of using input transistors of a voltage class lower than the supply voltage (for example, 1.8V v. 3V),
- facilitated use in a wide variety of circuits such as, for example, High Voltage—HV operational amplifier (OpAmps).

There is a need in the art to contribute in providing such an improved solution.

SUMMARY

One or more embodiments relate to a device (for example, a device including digital-to-analog or analog-to-digital converters) and a corresponding method.

The claims are an integral part of the disclosure of one or more embodiments as provided herein.

One or more embodiments may provide an arrangement which facilitates achieving high precision without penalizing performance.

In one or more embodiments, the drain-source voltage $V_{DS}$ of an input couple or pair may contribute in keeping the characteristic of the circuit constant.

In an embodiment, a circuit, includes: a power-supply terminal, at least one current generator transistor arranged with its current path between the power-supply terminal and a current supply node, an input transistor pair including a first input transistor and a second input transistor, the first and second input transistors having their current paths coupled to the current supply node, the first input transistor having a control terminal configured for receiving an input signal to the circuit, a cascode transistor pair including a first cascode transistor and a second cascode transistor, the current paths of the first and second cascode transistor between the supply terminal and the current paths of the second input transistor and the first input transistor respectively; the cascode transistors in the cascode transistor pair having their control terminals coupled to a common control node, and a bias circuit having a bias input configured for receiving said input signal and a bias output coupled to the common node of the control terminals of the cascode transistors in the cascode transistor pair, the bias circuit including a signal tracking circuit stage active between the bias input and the bias output wherein the common node of the control terminals of the cascode transistors in the cascode transistor pair is configured to track the input signal to the circuit.

In one or more embodiments, the first cascode transistor and the second cascode transistor in the cascode transistor pair may have their current paths coupled to the supply terminal via respective paired transistors arranged with their current paths between the supply terminal and the first cascode transistor and the second cascode transistor in the cascode transistor pair, respectively.

In one or more embodiments, one of the transistors in said respective paired transistors is diode-coupled.

In one or more embodiments, the signal tracking circuit stage in the bias circuit may include a bias input transistor pair having control terminals commonly coupled to the bias input to receive said input signal, the bias input transistors in the bias input transistor pair having their current paths set between the supply terminal and ground with respective coupling resistors set between the bias input transistors in the bias input transistor pair and ground and a further resistor in the current path through one bias input transistor in the bias input transistor pair, the further resistor set between the one bias input transistor in the bias input transistor pair and the bias output.

In one or more embodiments, the first bias input transistor and the second bias input transistor in the bias input transistor pair may have their current paths coupled to the supply terminal via respective paired bias transistors arranged with their current paths between the supply terminal and the first bias input transistor and the second bias input transistor in the bias input transistor pair, respectively, with said further resistor between the first bias input transistor in the bias input transistor pair and a first paired bias transistor in said respective paired bias transistors.

In one or more embodiments, the second paired bias transistor in said respective paired bias transistors is diode-coupled.

In one or more embodiments, the signal tracking circuit stage in the bias circuit may be coupled with a current generation arrangement sensitive to said input signal dropping below a lower level, the current generation arrangement coupled to the transistors in the cascode transistor pair to maintain the common node of the control terminals of the cascode transistors in the cascode transistor pair at a fixed bottom value with the input signal below said lower level.

In one or more embodiments, the current generation arrangement may be coupled between said further resistor and the first bias input transistor in the bias input transistor pair.

In an embodiment, a device may include a circuit according to one or more of the embodiments described above.

Such a device may include: a digital-to-analog converter having the circuit as an output buffer, or an analog-to-digital converter having the circuit as an input buffer.

In an embodiment, a method comprises: providing at least one current generator transistor arranged with its current path between a power-supply terminal and a current supply node, providing an input transistor pair including a first input transistor and a second input transistor, the first and second input transistors having their current paths coupled to the current supply node, by applying to the control terminal of the first input transistor an input signal to the circuit, providing a cascode transistor pair including a first cascode transistor and a second cascode transistor with the current paths of the first and second cascode transistors between the supply terminal and the current paths of the second input transistor and the first input transistor, respectively; the cascode transistors in the cascode transistor pair having their control terminals coupled to a common control node, and providing a bias circuit having a bias input receiving said input signal and a bias output coupled to the common node of the control terminals of the cascode transistors in the cascode transistor pair, the bias circuit including a signal tracking circuit stage acting between the bias input and the bias output wherein the common node of the control terminals of the cascode transistors in the cascode transistor pair tracks the input signal to the circuit.

In an embodiment, a circuit comprises: a pair of differential input transistors coupled to a tail current source, wherein one input transistor of said pair of differential input transistors has a control node configured to receive an input signal; a pair of load transistors coupled in series with the pair of differential input transistors and having a first bias common control terminal biased by a first bias signal; a bias generator circuit configured to generate said first bias signal. The bias generator circuit comprises: a first pair of transistors having a first common control terminal configured to receive said input signal; a second pair of transistors coupled in series with the first pair of transistors and having a second common control terminal; a first current source coupled to source a first current through a first diode-connected transistor coupled to a node between a first transistor of the first pair of transistors and a first transistor of the second pair of transistors; a second current source coupled to source a second current through a second diode-connected transistor; and a circuit configured to combine the first and second currents to generate the first bias signal.

In an embodiment, a circuit comprises: a pair of differential input transistors coupled to a tail current source, wherein one input transistor of said pair of differential input transistors has a control node configured to receive an input signal; a folded cascode output stage including a pair of cascode transistors coupled to the pair of load transistors and having a first bias common control terminal configured to receive a first bias signal; a bias generator circuit configured to generate said first bias signal. The bias generator circuit comprises: a first pair of transistors having a first common control terminal configured to receive said input signal; a second pair of transistors coupled in series with the first pair of transistors and having a second common control terminal; and a first output node coupled between a first transistor of the first pair of transistors and a first transistor of the second pair of transistors, said first output node generating the first bias signal which tracks the input signal.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
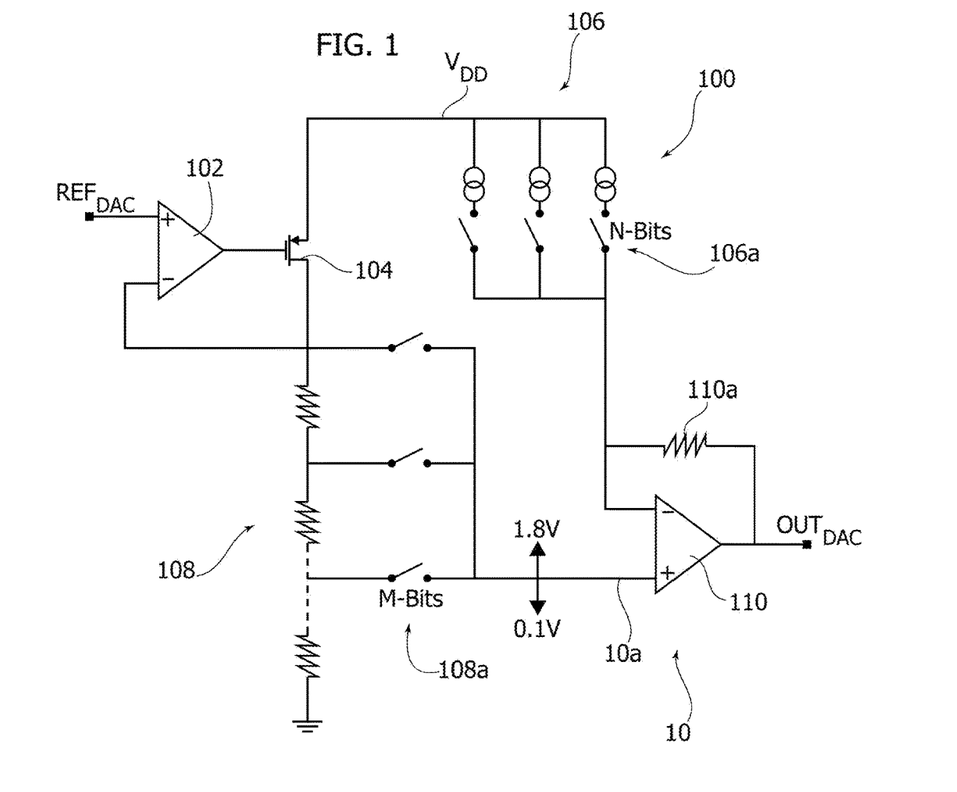
FIG. 1 is a block diagram of a digital-to-analog converter (DAC)

In FIG. 1, reference 100 denotes as a whole a device such as a digital-to-analog converter (DAC) including an output buffer circuit stage 10.

The converter 100 exemplified in FIG. 1 includes an input differential circuit stage 102 which receives on a (non-inverting) input a signal $REF_{DAC}$ and whose output drives a transistor (for example, a MOSFET transistor) 104 via the control terminal thereof (gate, in the case of a field effect transistor such as a MOSFET transistor). The current path (for example, the source terminal) of the transistor 104 is coupled to a supply line $V_{DD}$ and to a set of current generators 106 having associated electronic switches 106a configured to be turned on and off (that is, made conductive and non-conductive) according to the "N-Bits" of the converter.

The converter 100 exemplified in FIG. 1 also includes a set of resistors 108 arranged in a voltage-divider arrangement between the transistor 104 and ground and having associated respective electronic switches 108a configured to be selectively turned on and off (that is made conductive and non-conductive) according to the so-called "M-Bits" of the converter.

The top end of the divider 108 (which is coupled to the transistor 104, for example, to the drain thereof) is also coupled in a feedback path to the other (inverting) input of the differential input circuit stage 102.

The common ends of the switches 106a and 108a are coupled to the inputs (for example, inverting and non-inverting) of a differential circuit stage (for example, an operational amplifier) 110 in an output buffer 10 having a (negative) feedback resistor 110a coupled between the output terminal of the converter 100, providing an output signal $OUT_{DAC}$ and the (inverting) input of the circuit stage 110.

Further details on the structure and operation of a converter as exemplified in FIG. 1 can be derived, for example, from U.S. Pat. Nos. 7,098,831 or 7,348,912 (incorporated by reference), thus making it unnecessary to provide a detailed description herein.

It will otherwise be appreciated that reference to the arrangement of FIG. 1 is merely exemplary of a possible context of use of embodiments: the instant detailed description makes reference to a digital-to-analog converter (DAC) as a possible context of use; however one or more embodiments can be applied, for example, to an analog-to-digital converter (ADC) or, more generally, to circuits for which the ability to withstand large input voltage swings without unduly penalizing performance is a desirable feature.

For instance, operation of a converter arrangement as exemplified in FIG. 1 may be facilitated by the capability of admitting (for example, at the non-inverting input 10a of the buffer circuit stage 10) voltage ranges from, say 0.1V to 1.8V (also) in circumstances where the circuit is supplied with a voltage in a range from, for example, 3.2V to 2.8V.

Figure 2:
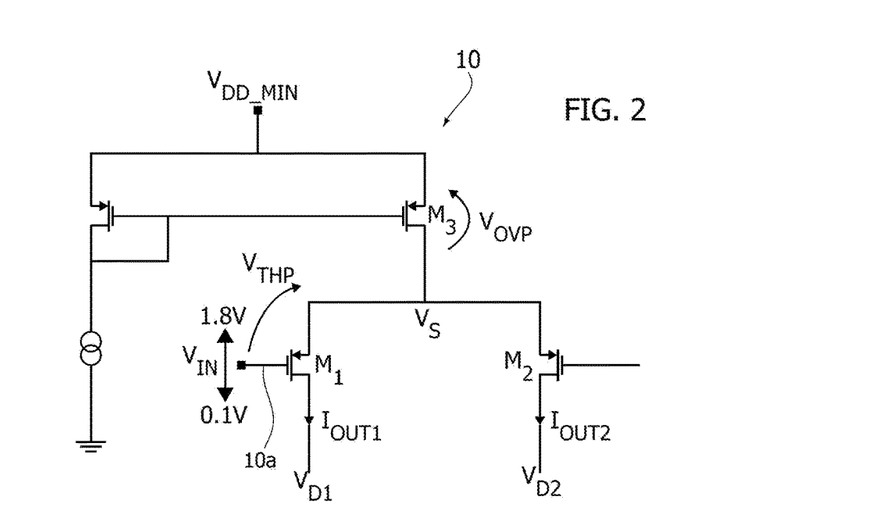
FIGS. 2 and 3 are exemplary of possible implementations of a part of the circuit of FIG. 1.

The circuit diagram of FIG. 2 is exemplary of possible critical aspects of such a situation.

In FIG. 2, $V_{DD\_MIN}$ (for example, 2.8V) is exemplary of a lower bound of an admissible range of the values for the supply voltage $V_{DD}$ applied to an input transistor pair $M_1$, $M_2$ of the differential circuit stage 110 via a tail transistor $M_3$ in a current mirror pair supplied by a voltage $V_{DD}$, with the control electrode (for example, gate in the case of a field effect transistor such as a MOSFET transistor) of $M_1$ receiving an input voltage between 0.1V and 1.8V at the input terminal 10a.

It will be otherwise appreciated that the quantitative values given in the foregoing are merely exemplary and not intended to be limitative of the embodiments discussed in the following.

Transistors (such as MOSFET transistors) sustaining 5V can be used in an arrangement as exemplified in FIG. 2 in an output buffer as exemplified at 10 with a power supply $V_{DD}$ around 3V.

These transistors have a high threshold voltage $V_T$ so that with a threshold voltage $V_T$ of 1V or higher, and in the presence of an input gate voltage for $M_1$ and $M_2$ of about 1.8V, this may result in a value of 2.8V or higher for the voltage at the node $V_S$ (for example, drain of $M_3$) where $M_1$, $M_2$ are coupled (for example, via their sources). This leaves no headroom for the tail transistor $M_3$ to work as desired when the supply voltage $V_{DD}$ reaches a value of, for example, $V_{DD\_MIN}$=2.8 as exemplified in FIG. 2.

Figure 3:
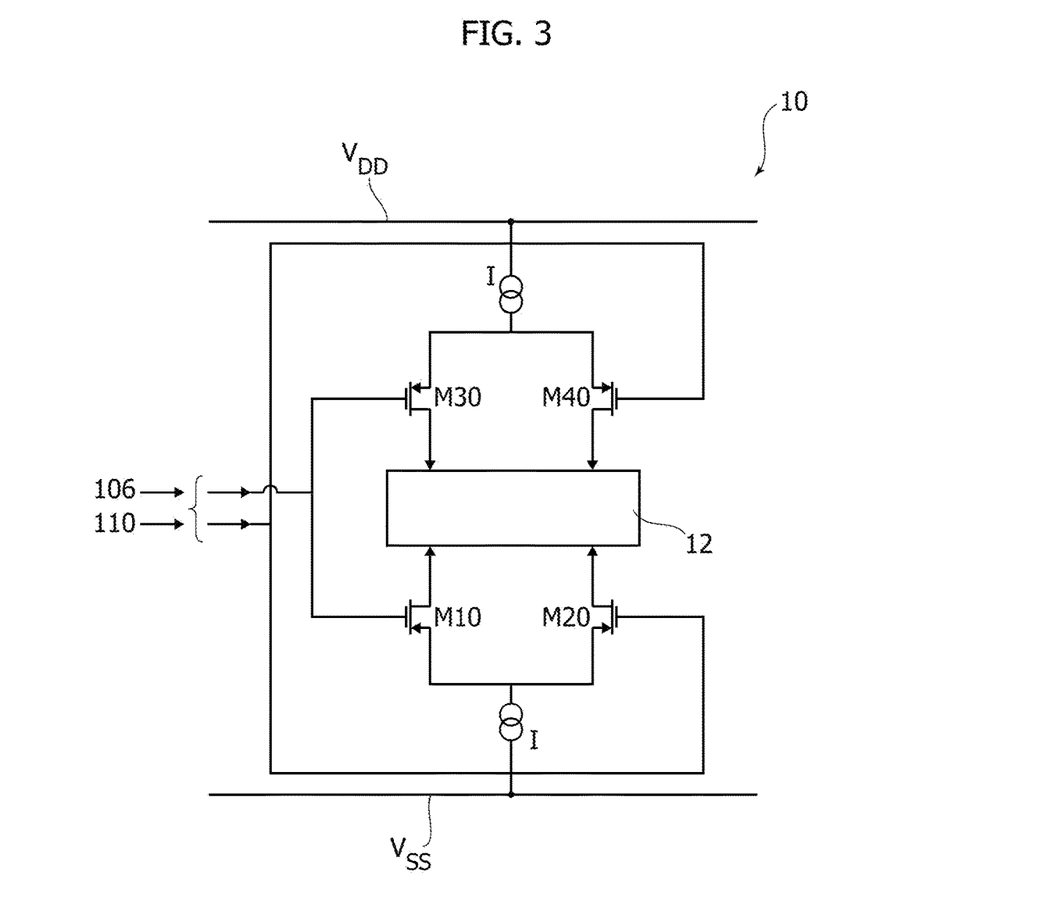

A possible approach in dealing with these issues is represented by the solution exemplified in FIG. 3, including a full-swing input circuit stage with an n-channel input circuit stage M10, M20 in parallel to a p-channel input circuit stage M30, M40 and a current summation circuit stage 12 set there between.

In an arrangement as exemplified in FIG. 3, the circuit stages M10, M20 and M30, M40 are coupled to respective current generators in turn coupled to supply lines $V_{DD}$ and $V_{SS}$).

Even if both p-channel and n-channel thresholds are high, when the input signal is close to $V_{SS}$ (ground) the p-channel transistors M30, M40 and the upper tail current (as provided, for example, by a p-channel transistor) may operate correctly while the n-channel transistors M10, M20 and the lower tail current are off. Complementary operation occurs when the input signal is close to $V_{DD}$.

An arrangement as exemplified in FIG. 3 facilitates admitting a large input swing for the circuit, at the expense of an offset depending on the input signal amplitude. This results in a low common mode rejection ratio—CMRR for an amplifier in an amplifying chain or in degradation in terms of differential non-linearity (DNL) or integral non-linearity (INL) in so far as monotonicity cannot be achieved, for example, in a circuit operating as an output buffer in a digital-to-analog converter or as an input buffer in an analog-to-digital converter.

Still another approach may involve using for $M_1$, $M_2$ and $M_3$ in an arrangement as exemplified in FIG. 2, for example, 1.8V MOS transistors. Such transistors may in fact exhibit lower threshold voltages, for example, less than 0.6V: in that way, for an input of 1.8V, the voltage $V_S$ will be around 2.5V thus leaving enough voltage headroom for $M_3$ to operate correctly as a tail current generator. However, for an input as low as 0.1V, $V_S$ will be about 0.8V with $M_3$ having a drain-source voltage $V_{DS}$ higher than 1.8V, thus exiting the upper bound rating of the process.

Figure 4:
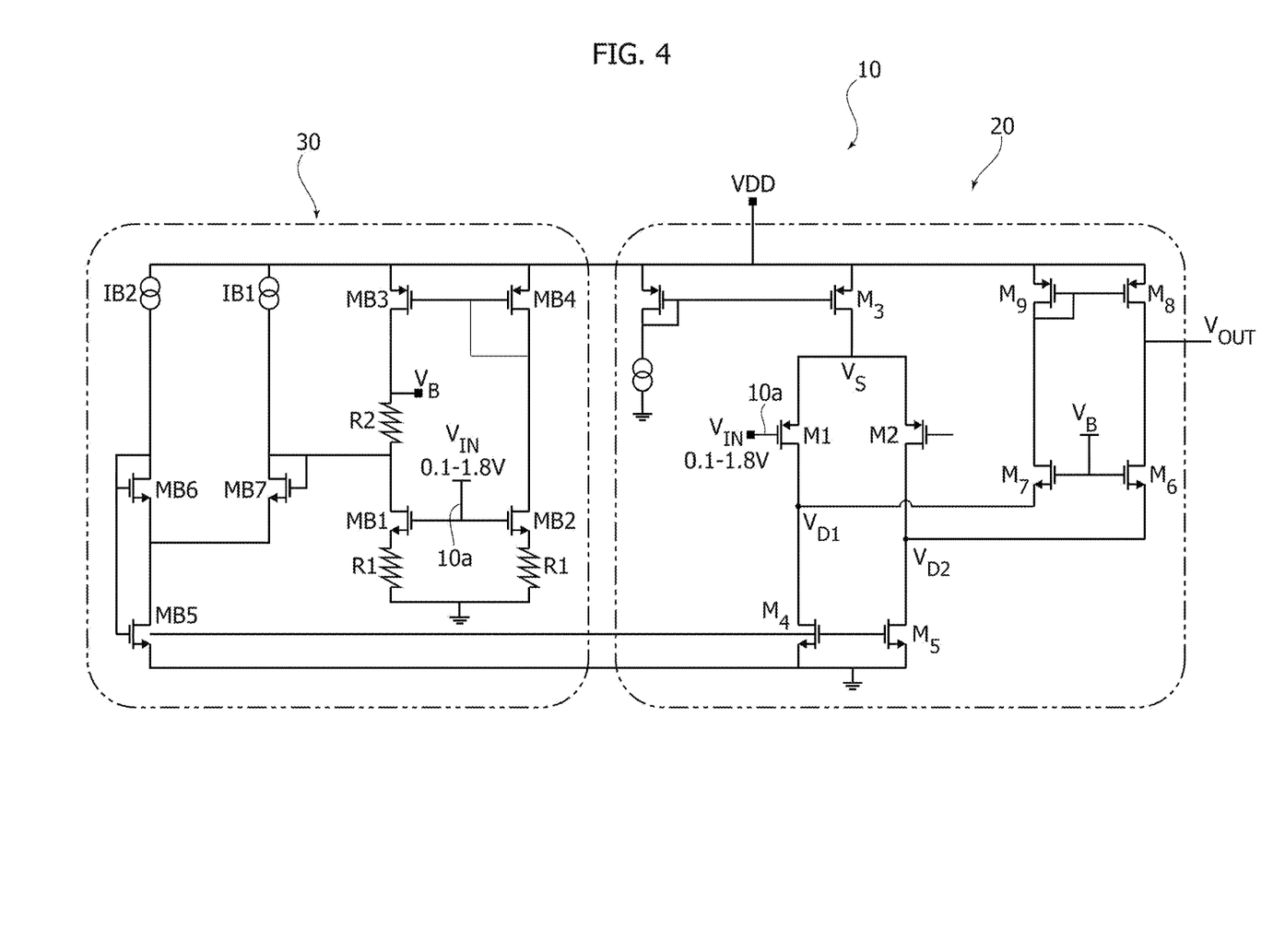
FIG. 4 is a circuit diagram exemplary of embodiments.

One or more embodiments as exemplified in FIG. 4 may retain the basic layout exemplified in FIG. 2:
  by selecting a folded cascode topology for an associated output circuit as indicated by 20 on the right-hand side of FIG. 4, and
  by biasing the common gate of the cascode transistors (for example, $M_6$, $M_7$ in FIG. 4) by means of a signal $V_B$ generated by an "input tracking" dynamic bias circuit as indicated by 30 on the left-hand side of FIG. 4.

In the right-hand portion of FIG. 4 like parts or elements as those already discussed in connection with previous figures such as FIG. 2 are indicated with like symbols/numerals: a corresponding detailed description will not be repeated here for the sake of brevity.

In the exemplary folded cascode portion 20 of FIG. 4, opposite to the tail transistor $M_3$ (node $V_S$), the current paths of the transistors $M_1$, $M_2$ are arranged in series with the current paths (again source-drain paths, in the case of field effect transistors such a MOSFET transistor) of two transistors (for example, MOSFET transistors) $M_4$, $M_5$ set between the transistors $M_1$, $M_2$ and ground.

Also, intermediate nodes: a) between the transistor $M_1$ and $M_4$, where a voltage $V_{D1}$ is present, and b) between the transistor $M_2$ and $M_5$, where a voltage $V_{D2}$ is present, are coupled with the current paths (for example, to the source terminals, in the case of field effect transistors such a MOSFET transistor) of the cascode transistors $M_7$ and $M_6$. These latter transistors have their control terminals (gates, in the case of a field effect transistors such as MOSFET transistors) coupled to a voltage $V_B$ (generated in the bias circuit 30 as discussed in the following).

In the exemplary folded cascode portion 20 of FIG. 4, the cascode transistors $M_6$, $M_7$ have their current paths (here, the drain terminals) coupled with the supply node at voltage $V_{DD}$ via a respective transistors $M_8$, $M_9$ having common control terminals (for example, gates) mutually coupled with $M_9$ connected in a diode arrangement.

In the exemplary embodiment of FIG. 4, the output $V_{OUT}$ from the circuit 10 is provided at an output terminal 10b such as the common drains of transistors M6 and M8 in the folded cascode amplifier.

The bias circuit 30 exemplified in FIG. 4 can be regarded as a "dynamic" bias circuit in view of its tracking ability of the input signal $V_{IN}$.

In the arrangement exemplified in FIG. 4, the input signal $V_{IN}$ is applied:
  at node 10a, to the control terminal of the transistor $M_1$ in the cascode circuit 20, and
  to the mutually coupled control terminals (gates, in the case of field effect transistors such as MOSFET transistors) of an input pair MB1, MB2 including transistors (such as MOSFET transistors) having their current generation terminals (source terminals, in the case of field effect transistors such as MOSFET transistors) coupled to ground via bias resistors R1.

The transistors MB1, MB2 have their current paths (here the drain terminals) coupled to the supply node $V_{DD}$ via respective further transistors (again MOSFET transistors, for instance) MB3, MB4 having their control terminals (gates, in the case of field effect transistors such as MOSFET transistors) mutually coupled with the transistor MB4 coupled in a diode arrangement.

A resistor R2 is set between the transistor MB1 and the transistor MB3 and the voltage $V_B$—which is applied to the (common) control terminals of the transistors $M_6$ and $M_7$ in the cascode circuit 20—available between the transistor MB3 and the resistor R2.

The signal available between the resistor R2 and the transistor MB1 (that is the signal at the terminal of the resistor R2 opposed to the one at which the voltage $V_B$ is available) is coupled to a transistor MB7 in a diode arrangement crossed by a current generator IB1.

The source terminal of MB7 is in turn connected to the source and drain terminals of two transistors MB6 and MB5, respectively, with transistor MB6 is connected in a diode arrangement with control terminal (gate, in the case of a field effect transistors such as a MOSFET transistor) of MB6 coupled to the homologous terminal of MB5 and to a current generator IB2.

The transistor MB5 shares a common connection of its control terminal (gate terminal, in the case of a field effect transistor such as a MOSFET transistor) with the homologous terminals of the transistors $M_4$ and $M_5$.

In operation of an arrangement as exemplified in FIG. 4, when the input signal $V_{IN}$ is low (for example, close to 0.1V) no current will flow through MB1, MB2, MB3 and MB4; no current will likewise flow through the resistor R2. Consequently, a bottom "pedestal" value for $V_B$ (for example, $V_{B0}$) can be selected by sizing MB5, MB6, MB7, IB1 and IB2.

In one or more embodiments such a value $V_{B0}$ can be fixed so that $V_{D1}$ and $V_{D2}$ are in, say, the hundred mV range, so that—in those circumstances—$M_4$ and $M_5$ will be saturated thus operating essentially as current generators.

As a result of an increase in the input signal above the threshold voltage of MB1 and MB2, all of MB1, MB2, MB3 and MB4 will start conducting a current $I_{R1}=I_{R2}=(V_{IN}-V_{THN})/R1$, where $V_{THN}$ indicates the threshold voltages of these transistors, which may be reasonably assumed to be essentially the same.

In that way, the currents $I_{R1}$ and $I_{R2}$ will have a value proportional to the input signal $V_{IN}$. This will in turn result in a voltage drop on R2 which can be expressed as $V_{drop\_R2}=(R2/R1)(V_{IN}-V_{THN})$, that is still proportional to the input voltage amplitude.

The value of $V_B$ will be given (as a function of the input signal $V_{IN}$) by a relationship such as:

$$V_B=V_{B0}+(R2/R1)(V_{IN}-V_{THN}).$$

Since $V_{D1}=V_{D2}=(V_B-V_{THN})$ the drains of the input transistors will "track" the input voltage applied on their control terminals thus facilitating having a value for $V_{DS}$ (much) lower than 1.8V and almost constant versus their input signal amplitude.

Figure 5:
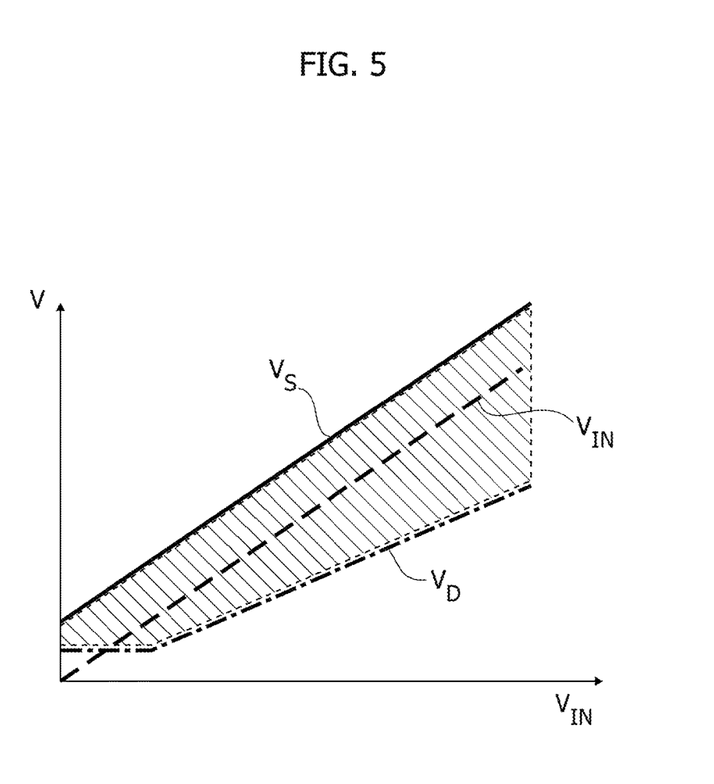
FIG. 5 is exemplary of possible operation of embodiments.

Such a behavior is exemplified in FIG. 5, where the behavior of various signal is shown in an arbitrary ordinate scale (for example, volt V) as a function of $V_{IN}$ (abscissa scale).

The dashed line represents, so-to-say, $V_{IN}$ itself, while the upper continuous line represents the common source voltage $V_S$ of M1 and M2, and finally the lower chain line represents the voltage $V_{D1}=V_{D2}=V_D$ at the drains of M1 and M2, respectively; the shaded area represents $V_{DS1}=V_{DS2}=V_{DS}$, i.e. the voltage difference between $V_S$ and $V_D$ which is approximately constant versus $V_{IN}$, other than at the left hand side (low values for Vin) where the "pedestal" behavior of $V_{B0}$ comes into play.

One or more embodiment may thus provide one or more of the following advantages:
the drain voltages of the input transistor pair are rendered capable of tracking the input signal,
the drain/source voltage of the input pair exhibits a (very) low dependence on the input signal,
controlling the ratio of the values R2/R1 of the homologous resistors exemplified in FIG. 4 makes it possible to tune the slope of the tracking action,
the possibility exists of dispensing with a rail-to-rail input circuit stage, thus avoiding CMRR and INL/DNL degradation,
one or more embodiments may be implemented by using transistors of a voltage class lower than the power-supply value.

One or more embodiments may thus concern a circuit (for example, 10), including:
a power-supply terminal (for example, $V_{DD}$),
at least one current generator transistor (for example, $M_3$) arranged with its current path (for example, source-drain in the exemplary case of a field-effect transistor) between the power-supply terminal and a current supply node (for example, $V_S$),
an input transistor pair (for example, $M_1$, $M_2$) including a first input transistor and a second input transistor, the first and second input transistors having their current paths coupled to the current supply node, the first input transistor having a control terminal (for example, gate, in the exemplary case of a field-effect transistor) configured for receiving an input signal (for example, $V_{IN}$) to the circuit,
a cascode transistor pair (for example, $M_6$, $M_7$) including a first cascode transistor and a second cascode transistor, the current paths of the first and second cascode transistor between the supply terminal and the current paths of the second input transistor and the first input transistor respectively; the cascode transistors in the cascode transistor pair having their control terminals coupled to a common control node (for example, $V_B$), and
a bias circuit (for example, 30) having a bias input configured for receiving said input signal and a bias output coupled to the common node of the control terminals of the cascode transistors in the cascode transistor pair, the bias circuit (30) including a signal tracking circuit stage (for example, MB1, MB2, MB3, MB4, R1, R2) active between the bias input and the bias output wherein the common node of the control terminals of the cascode transistors in the cascode transistor pair is configured to track the input signal to the circuit. In one or more embodiments, the first cascode transistor and the second cascode transistor in the cascode transistor pair may have their current paths coupled to the supply terminal via respective paired transistors (for example, $M_8$, $M_9$) arranged with their current paths between the supply terminal and the first cascode transistor and the second cascode transistor in the cascode transistor pair, respectively.

In one or more embodiments, one (for example, $M_9$) of the transistors in said respective paired transistors is diode-coupled (for example, gate shorted to drain).

In one or more embodiments, the signal tracking circuit stage in the bias circuit may include a bias input transistor pair (for example, MB1, MB2) having control terminals commonly coupled to the bias input to receive said input signal, the bias input transistors in the bias input transistor pair having their current paths set between the supply terminal and ground with respective coupling resistors (for example, R1) set between the bias input transistors in the bias input transistor pair and ground and a further resistor (for example, R2) in the current path through one (for example, MB1) bias input transistor in the bias input transistor pair, the further resistor set between the one bias input transistor (for example, MB1) in the bias input transistor pair and the bias output (for example, $V_B$).

In one or more embodiments, the first bias input transistor and the second bias input transistor in the bias input transistor pair may have their current paths coupled to the supply terminal via respective paired bias transistors (for example, MB3, MB4) arranged with their current paths between the supply terminal and the first bias input transistor and the second bias input transistor in the bias input transistor pair, respectively, with said further resistor between the first bias input transistor in the bias input transistor pair and a first paired bias transistor (for example, MB3) in said respective paired bias transistors.

In one or more embodiments, the second paired bias transistor (for example, MB4) in said respective paired bias transistors is diode-coupled (for example, gate shorted to drain).

In one or more embodiments, the signal tracking circuit stage in the bias circuit may be coupled with a current generation arrangement (for example, IB1, IB2, IB5, IB6, IB7) sensitive to said input signal dropping below a lower level, the current generation arrangement coupled (for example, M4, M5, VD1, VD2) to the transistors in the cascode transistor pair to maintain the common node of the control terminals of the cascode transistors in the cascode transistor pair at a fixed bottom value (for example, $V_{B0}$) with the input signal below said lower level.

In one or more embodiments, the current generation arrangement may be coupled between said further resistor (for example, R2) and the first bias input transistor (for example, MB1) in the bias input transistor pair.

A device according to one or more embodiments, may include a circuit according to one or more embodiments.

Such a device may include: a digital-to-analog converter having the circuit as an output buffer, or an analog-to-digital converter having the circuit as an input buffer.

A method according to one or more embodiments may include: providing at least one current generator transistor arranged with its current path between a power-supply terminal and a current supply node, providing an input transistor pair including a first input transistor and a second input transistor, the first and second input transistors having their current paths coupled to the current supply node, by applying to the control terminal of the first input transistor an input signal to the circuit, providing a cascode transistor pair including a first cascode transistor and a second cascode transistor with the current paths of the first and second cascode transistors between the supply terminal and the current paths of the second input transistor and the first input transistor, respectively; the cascode transistors in the cascode transistor pair having their control terminals coupled to a common control node, and providing a bias circuit having a bias input receiving said input signal and a bias output coupled to the common node of the control terminals of the cascode transistors in the cascode transistor pair, the bias circuit including a signal tracking circuit stage acting between the bias input and the bias output wherein the common node of the control terminals of the cascode transistors in the cascode transistor pair tracks the input signal to the circuit.

Without prejudice to the underlying principles, the details and embodiments may vary, even significantly, with respect to what has been described by way of example only without departing from the extent of protection. The extent of protection is defined by the annexed claims.

The invention claimed is:

1. A circuit, including:
   at least one current generator transistor having a current path connected between a power-supply terminal and a current supply node;
   an input transistor pair including a first input transistor and a second input transistor, wherein current paths of the first and second input transistors are coupled to the current supply node, the first input transistor having a control terminal configured to receive an input signal;
   a cascode transistor pair including a first cascode transistor and a second cascode transistor, wherein current paths of the first and second cascode transistors are connected between the power-supply terminal and the current paths of the second input transistor and the first input transistor respectively; the cascode transistors in the cascode transistor pair having control terminals coupled to a common control node; and
   a bias circuit having a bias input configured to receive said input signal and a bias output coupled to the common node of the control terminals of the cascode transistors in the cascode transistor pair, wherein the bias circuit includes a signal tracking circuit stage configured to cause the bias output to track the input signal.

2. The circuit of claim 1, wherein the current paths of the first and second cascode transistors in the cascode transistor pair are coupled to the supply terminal via respective paired transistors, the respective paired transistors having current paths connected between the power-supply terminal and the first cascode transistor and the second cascode transistor in the cascode transistor pair, respectively.

3. The circuit of claim 2, wherein one transistor of said respective paired transistors is diode-coupled.

4. The circuit of claim 1, wherein the signal tracking circuit stage in the bias circuit comprises:
   a bias input transistor pair having control terminals commonly coupled to the bias input to receive said input signal, wherein current paths of the bias input transistors in the bias input transistor pair are connected between the power-supply terminal and ground with respective coupling resistors set between the bias input transistors in the bias input transistor pair and ground; and
   a further resistor in the current path through one bias input transistor in the bias input transistor pair, the further resistor connected between the one bias input transistor in the bias input transistor pair and the bias output.

5. The circuit of claim 4, wherein the current paths of first and second bias input transistors in the bias input transistor pair are coupled to the power-supply terminal via respective paired bias transistors, said respective paired bias transistors having current paths connected between the power-supply terminal and the first bias input transistor and the second bias input transistor in the bias input transistor pair, respectively, with said further resistor is connected between the first bias input transistor in the bias input transistor pair and the first paired bias transistor in said respective paired bias transistors.

6. The circuit of claim 5, wherein one transistor of said paired bias transistors is diode-coupled.

7. The circuit of claim 4, wherein the signal tracking circuit stage in the bias circuit is coupled with a current generation arrangement sensitive to said input signal dropping below a lower level, the current generation arrangement configured to maintain the common node of the control terminals of the cascode transistors in the cascode transistor pair at a fixed bottom value with the input signal below said lower level.

8. The circuit of claim 7, wherein the current generation arrangement is coupled between said further resistor and one bias input transistor in the bias input transistor pair.

9. A device including a circuit according to claim 1.

10. The device of claim 9, wherein the device includes:
a digital-to-analog converter having the circuit as an output buffer, or an analog-to-digital converter having the circuit as an input buffer.

11. A circuit, comprising:
a pair of differential input transistors coupled to a tail current source, wherein one input transistor of said pair of differential input transistors has a control node configured to receive an input signal;
a pair of load transistors coupled in series with the pair of differential input transistors and having a first bias common control terminal biased by a first bias signal;
a bias generator circuit configured to generate said first bias signal, wherein the bias generator circuit comprises:
a first pair of transistors having a first common control terminal configured to receive said input signal;
a second pair of transistors coupled in series with the first pair of transistors and having a second common control terminal;
a first current source coupled to source a first current through a first diode-connected transistor coupled to a node between a first transistor of the first pair of transistors and a first transistor of the second pair of transistors;
a second current source coupled to source a second current through a second diode-connected transistor; and
a circuit configured to combine the first and second currents to generate the first bias signal.

12. The circuit of claim 11 further comprising:
a folded cascode output stage including a pair of cascode transistors coupled to the pair of load transistors and having a second bias common control terminal configured to receive a second bias signal; and
wherein the bias generator circuit further comprises a resistor connected between said node and the first transistor of the second pair of transistors and configured to generate said second bias signal.

13. The circuit of claim 12, wherein the folded cascode output stage further includes a current mirror circuit connected in series with the pair of cascode transistors.

14. The circuit of claim 12, wherein the bias generator circuit further comprises a pair of resistors connected between the first pair of transistors and a reference voltage node.

15. The circuit of claim 14, wherein the reference voltage node is ground.

16. The circuit of claim 11, further including a further bias circuit configured to bias the tail current source.

17. A circuit, comprising:
a pair of differential input transistors coupled to a tail current source, wherein one input transistor of said pair of differential input transistors has a control node configured to receive an input signal;
a folded cascode output stage including a pair of cascode transistors coupled to the pair of load transistors and having a first bias common control terminal configured to receive a first bias signal;
a bias generator circuit configured to generate said first bias signal, wherein the bias generator circuit comprises:
a first pair of transistors having a first common control terminal configured to receive said input signal;
a second pair of transistors coupled in series with the first pair of transistors and having a second common control terminal; and
a first output node coupled between a first transistor of the first pair of transistors and a first transistor of the second pair of transistors, said first output node generating the first bias signal which tracks the input signal.

18. The circuit of claim 17, further comprising:
a pair of load transistors coupled in series with the pair of differential input transistors and having a second bias common control terminal biased by a second bias signal;
wherein the bias generator circuit is further configured to generate said second bias signal.

19. The circuit of claim 18, wherein the bias generator circuit comprises:
a second output node coupled between the first transistor of the first pair of transistors and the first transistor of the second pair of transistors;
a first current source coupled to source a first current through a first diode-connected transistor coupled to the second output node;
a second current source coupled to source a second current through a second diode-connected transistor; and
a circuit configured to combine the first and second currents to generate the second bias signal.

20. The circuit of claim 19, further comprising a resistor connected between said first and second output nodes.

21. The circuit of claim 17, wherein the folded cascode output stage further includes a current mirror circuit connected in series with the pair of cascode transistors.

22. The circuit of claim 17, wherein the bias generator circuit further comprises a pair of resistors connected between the first pair of transistors and a reference voltage node.

23. The circuit of claim 22, wherein the reference voltage node is ground.

24. The circuit of claim 17, further including a further bias circuit configured to bias the tail current source.

* * * * *